United States Patent [19]

Tan et al.

[11] Patent Number: 5,612,098
[45] Date of Patent: Mar. 18, 1997

[54] METHOD OF FORMING A THIN FILM MAGNETIC STRUCTURE HAVING FERROMAGNETIC AND ANTIFERROMAGNETIC LAYERS

[75] Inventors: Minshen Tan, Fremont; Hua-Ching Tong, San Jose; Francis H. Liu, Fremont; Swie-In Tan, San Jose, all of Calif.

[73] Assignee: Read-Rite Corporation, Milpitas, Calif.

[21] Appl. No.: 696,656

[22] Filed: Aug. 14, 1996

[51] Int. Cl.⁶ .................................................. C23C 14/08
[52] U.S. Cl. ................. 427/529; 204/192.11; 204/192.2; 427/130; 427/131; 427/132; 427/530; 427/531
[58] Field of Search ..................................... 427/131, 130, 427/129, 132, 598, 529, 530, 531; 204/192.11, 192.2

*Primary Examiner*—Bernard Pianalto
*Attorney, Agent, or Firm*—Nathan N. Kallman

[57] ABSTRACT

A method of forming a magnetic structure having layers with different magnetization orientations provided by a common magnetic bias layer includes the steps of depositing an antiferromagnetic layer between first and second ferromagnetic layers. During the deposition of the first and second ferromagnetic layers, magnetization fields of different orientations are employed separately to induce different directions of magnetization in the first and second layers. The different directions of magnetization in the first and second layers are sustained, through the process of exchange coupling, by the interposed antiferromagnetic layer which serves as the bias layer. A magnetic structure thus fabricated, can be used as a read transducer capable of generating differential signals with common mode noise rejection, and can be used as a magnetic pole for a magnetic head with reduced Barkhausen noise.

23 Claims, 5 Drawing Sheets

METHOD OF FORMING A THIN FILM MAGNETIC STRUCTURE HAVING FERROMAGNETIC AND ANTIFERROMAGNETIC LAYERS

FIELD OF THE INVENTION

This invention relates to the formation of thin film magnetic assemblies and in particular to a method of forming thin films for magnetic heads or sensors with ferromagnetic (FM) and antiferromagnetic (AFM) layers.

BACKGROUND OF THE INVENTION

Presently known magnetic heads or transducers incorporate magnetoresistive (MR) sensors for detecting magnetically recorded data. A magnetoresistive transducer can read information on a recording medium with much narrower track widths and yields better signal-to-noise ratio. Also, the output signal generated during the data reading process is independent of the traveling speed of the recording medium.

A typical magnetoresistive head includes a magnetoresistive sensor located between two magnetic shield layers. Disposed between the magnetoresistive sensor and the magnetic shield layers are insulating layers. During the data reading mode, the magnetic shields shunt away stray fields, thereby confining the magnetic flux that emanates from a record medium and which is sensed by the MR sensor. The changes in magnetic flux correspondingly vary the resistivity of the magnetoresistive sensor. A direct electric current passing through the magnetoresistive sensor generates a varying voltage which represents the data stored in the recording medium.

Implementations of MR read heads at a miniaturized scale encounter various practical problems. First, the MR sensor needs to be properly biased. The ferromagnetic layer in its natural state comprises a multiple number of magnetic domains separated by domain walls. These domain walls are highly unstable. During normal operations, the constant merging and splitting of the domain walls generate undesirable signal noise, commonly called Barkhausen noise, which degrades the performance of the magnetic head. To suppress the signal noise, hard magnetic bias layers are normally attached to the ferromagnetic layers for the purpose of aligning the magnetic domains in a single domain configuration. Furthermore, to position the ferromagnetic layer in the linear operation region, another bias, called transverse bias, needs to be provided to the ferromagnetic layer. A soft adjacent layer formed of a material with relatively high coercivity and minimal magnetoresistive response is disposed adjacent to and spaced from the ferromagnetic layer to provide the necessary transverse bias. Exchange coupling between antiferromagnetic (AFM) and ferromagnetic (FM) materials is also used to achieve such biases. In more recent recording devices, such as spin valve heads, the AFM/FM structure becomes the critical part of the device. An AFM/FM structure with superior magnetic properties will enhance devices such as spin valve heads, dual MR heads and dual spin valve heads. Also in inductive devices wherein lamination is used to reduce eddy current and extend high frequency performance, insulating AFM materials may be used as lamination spacers to strengthen signal domain structure in the pole pieces of the inductive head. This approach can significantly reduce signal noise and enhance high frequency performance.

For the above reasons, there is a need to provide a method of fabricating magnetic transducers and magnetic film structures that can interact with storage media having narrow recorded data tracks with high linear recording densities, yet sufficiently sensitive to sense only the data signals recorded on the magnetic media with undesirable signal noise screened out.

SUMMARY OF THE INVENTION

An object of the invention is to provide a method of fabricating magnetic transducers capable of interacting with storage media having narrow data tracks with high linear recording densities.

Another object of the invention is to provide a method of fabricating magnetic read transducers with high sensitivity for sensing recorded signals from magnetic media while screening out undesirable signal noise.

Another object of the invention is to provide a method of fabricating magnetic film structures that can be used in laminated pole pieces free of Barkhausen noise.

A further object of the invention is to provide a method of fabricating magnetic read transducers with simplicity of design and reduction of processing steps thereby realizing lower manufacturing costs.

According to this invention, a thin film magnetic structure is fabricated by depositing an antiferromagnetic layer between first and second ferromagnetic layers in a sandwich type structure. During the deposition of the first and second ferromagnetic layers, magnetic fields of different orientations are applied, thereby inducing magnetization directions of different orientations in the first and second ferromagnetic layers. The different directions of magnetization in the first and second ferromagnetic layers are sustained by the interposed antiferromagnetic layer through exchange coupling. The magnetic structure can be used as a read transducer capable of generating assertive and complementary signals with common mode noise rejection. In accordance with this invention, there is only one layer, the antiferromagnetic layer, which provides magnetic biasing. The interposed antiferromagnetic layer forces single domain states in the first and second ferromagnetic layers, thereby eliminating the merging and splitting of domain walls and minimizing Barkhausen noise. A magnetic structure fabricated from the inventive method can also be used as a magnetic pole for an inductive write transducer.

BRIEF DESCRIPTION OF THE DRAWINGS

The invention will be described in greater detail with reference to the drawings in which.

Like reference numerals refer to like parts.

DETAILED DESCRIPTION OF THE INVENTION

Figure 1A:
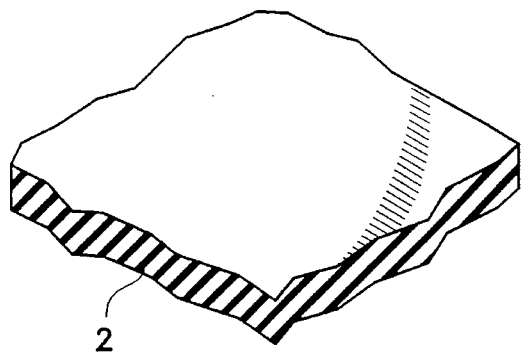
FIGS. 1A, 1B, 1C and 1D are isometric views, partly broken away, illustrating one method of forming a magnetic structure having layers with antiparallel magnetization orientations provided by a common magnetic bias layer.
Figure 1B:
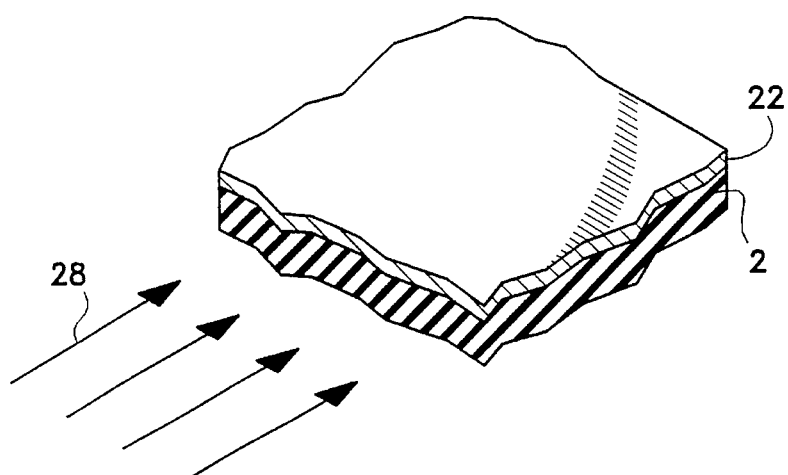
Figure 1C:
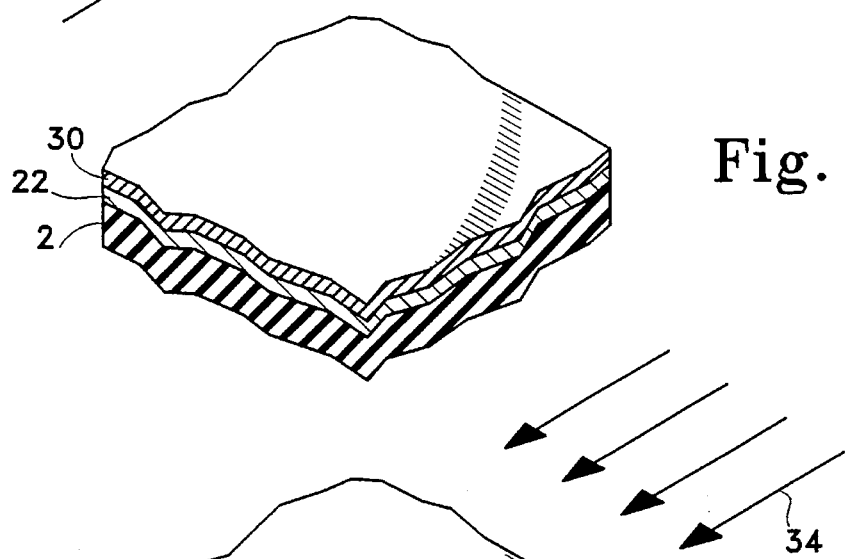
Figure 1D:
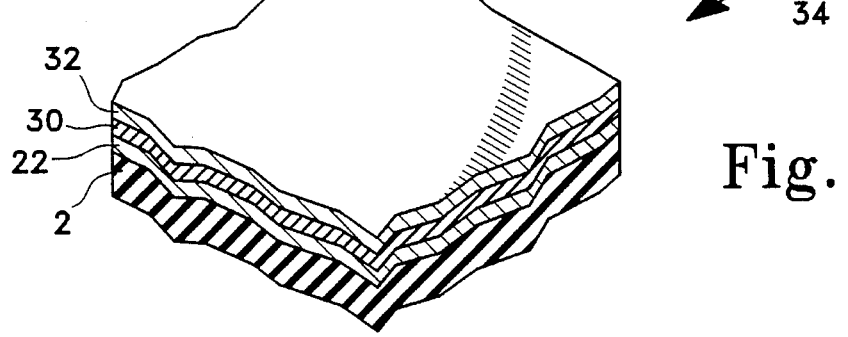
Figure 2:
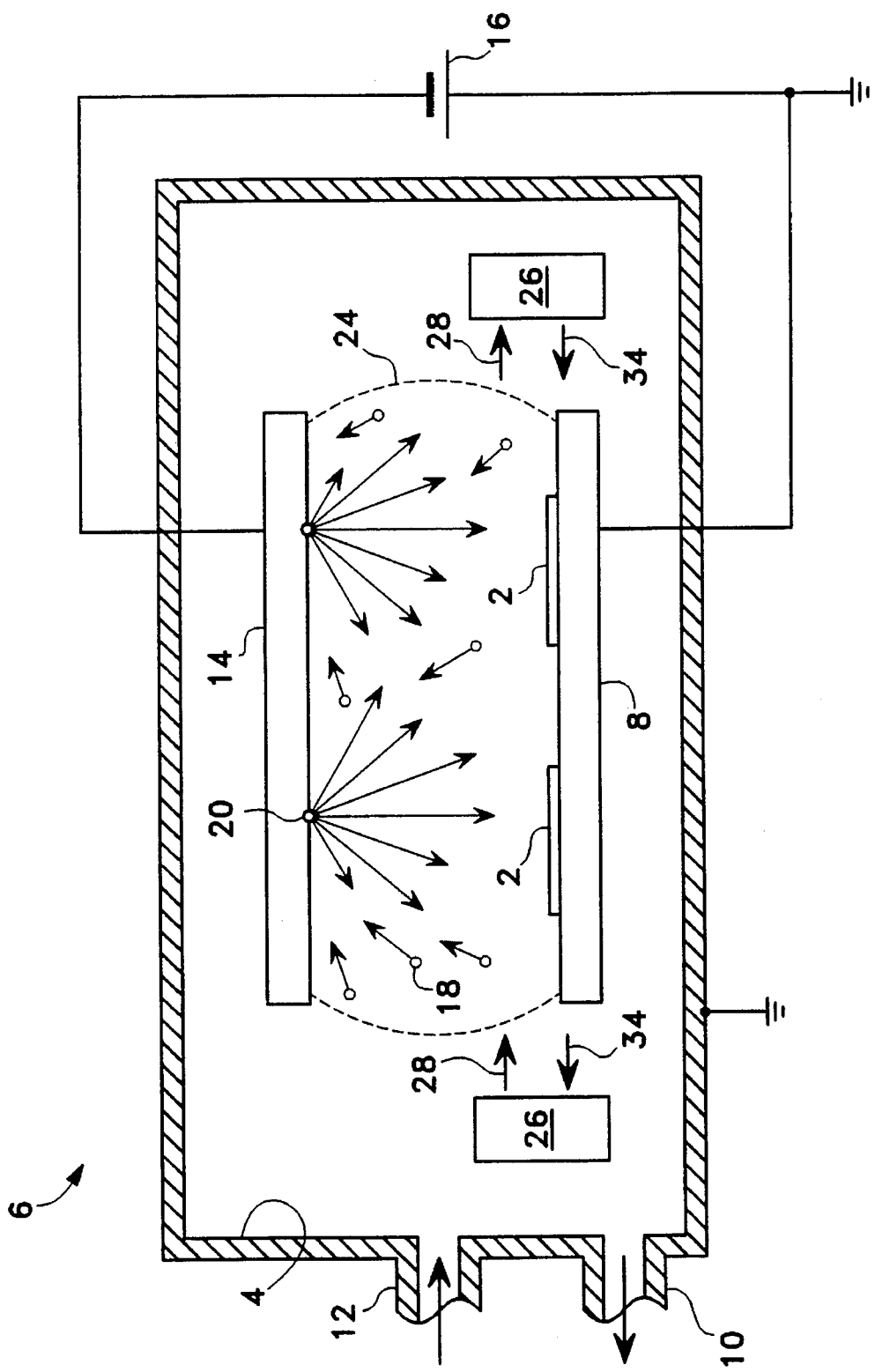
FIG. 2 is a cross-sectional side view showing the internal construction of a sputtering apparatus used for material deposition.

With reference to FIG. 1A–1D and FIG. 2, a substrate 2 is provided which can be a single piece substrate, or a substrate with other predeposited layers, for example. Alternatively, the substrate 2 can be part of another thin film structure. For instance, the substrate 2 can be a partially finished transducer in which the method of the present invention is employed to overlay a magnetic shield or pole layer above the transducer. Prior to deposition of any subsequent layers, the surface of the substrate 2 needs first to be polished and cleaned. The substrate 2 is located in a deposition chamber, such as the chamber 4 of a sputter apparatus 6 as shown in FIG. 2. An example of a sputter apparatus that can be used is model number 4400E, made by Perkin Elmer, Inc., of Mountain View, Calif. The substrate 2 is placed onto a substrate fixture 8 inside the chamber 4. The chamber 4 is then degassed through an gas outlet 10. After a satisfactory vacuum level inside the chamber 4 is reached, an inert gas, such as argon (Ar), is admitted into the chamber 4 through a gas inlet 12. When the inert gas inside the chamber 4 reaches a sufficiently high pressure level, the sputterer is then ready for deposition. In case of reactive sputter deposition, another gas such as oxygen is admitted to the chamber.

Inside the chamber 4, there is a target plate 14 which comprises the material to be deposited onto the substrate 2. The target plate 14 and the substrate fixture 8 are normally biased through a very steep electric potential by the voltage source 16 in the range of 500 Volts to 1000 Volts. The inert gas or mixture of inert and reactive gases between the target 14 and the substrate fixture 8 are thereby ionized. In essence, the electrons are attracted toward the substrate fixture 8 while the positively charged ions 18 are striking toward the target 14. In the process, the target molecules 20 are dislodged and dispersed from the target 14 and deposit onto the substrate 2 as a deposited layer of the target material. In reality, the gas ions 18 form a plasma 24 bombarding the target 14 constantly.

Simultaneously with the deposition process, electromagnets 26 inside the chamber 4 are activated, generating magnetic field 26 traversing the substrate 2. The purpose of the magnetic field 28 is to induce an uniaxial anisotropy in the first ferromagnetic layer 22 (FIG. 1B). The resultant structure up to this step is shown in FIG. 1B, in which the magnetic field 28 is also illustrated.

Next in the processing sequence is the step of depositing antiferromagnetic material. During deposition of the antiferromagnetic material, the electromagnets 26 are kept on to induce the unidirectional anisotropy in layer 22. The rest of the deposition process for this step is substantially the same as described above and is not further elaborated for the sake of clarity and conciseness. The resultant structure after this depositing step is shown in FIG. 1C, in which the antiferromagnetic layer is designated by reference numeral 30.

What follows is the step of depositing a second layer of ferromagnetic material 32. The method of depositing this layer 32 is substantially similar to the step of depositing the first layer 22 with the exception that during deposition, the electromagnets 26 are reversely energized thereby generating a magnetic field 34 with a different magnetization direction than the magnetic field 26 (FIG. 2). For the same reason as discussed above, the magnetic field 34 is utilized to induce another unidirectional anisotropy on the second ferromagnetic layer 32. The resultant structure up to this step is shown in FIG. 1D in which the magnetic field 34 is also depicted.

Next in the processing sequence is the step of depositing antiferromagnetic material. During deposition of the antiferromagnetic material, the electromagnets are kept on to maintain the magnetic orientation in the layer for establishing the first pinning direction with the subsequent antiferromagnetic layer. The rest of the deposition process for this step is substantially the same as described above and is not further elaborated for the sake of clarity and conciseness. The resultant structure following this deposition step is shown in FIG. 1C, in which the antiferromagnetic layer is designated by reference numeral 30. After layers 22 and 30 are deposited, an unidirectional anisotropy is established in layer 22 with its direction defined by the polarity of the applied magnetic field.

What follows is the step of depositing a second layer of ferromagnetic material 32. The method of depositing layer 32 is substantially similar to the step of depositing the first layer 22 with the exception that during deposition, the electromagnets 26 are reversely energized thereby generating a magnetic field with a different magnetization direction than the magnetic field 28 (FIG. 2). For the same reason as discussed above, the magnetic field 34 is utilized to induce another unidirectional anisotropy on the second ferromagnetic layer 32. The resultant structure up to this step is shown in FIG. 1D in which the magnetic field 34 is also depicted.

Figure 3A:
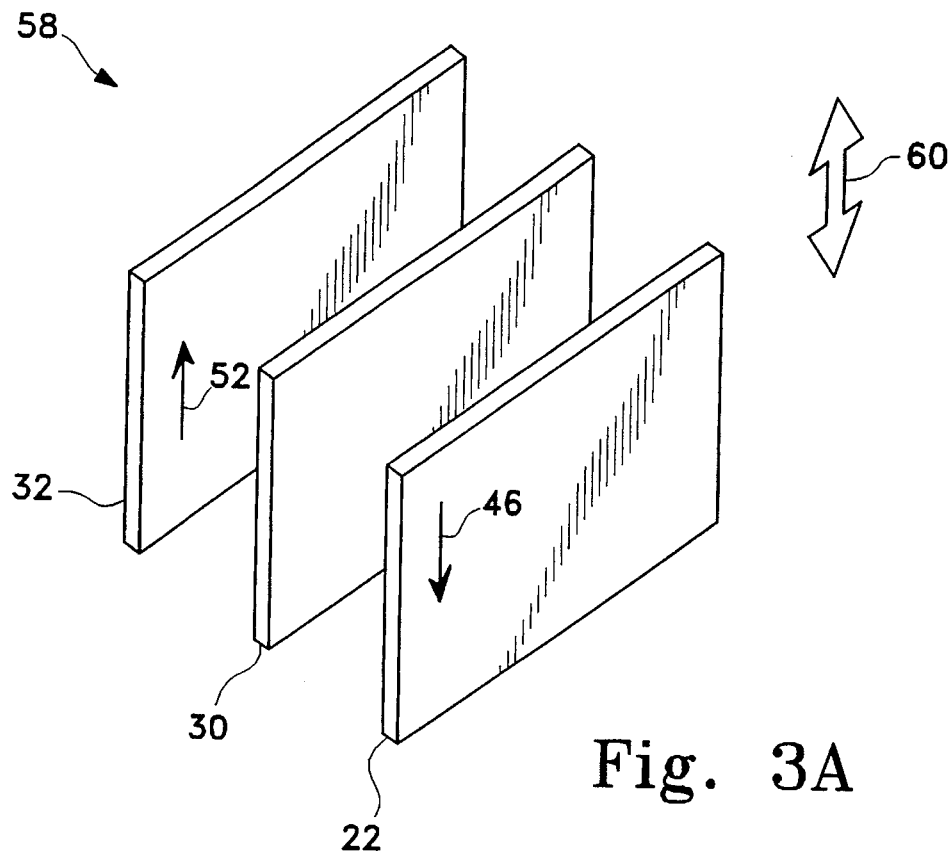
FIG. 3A is an exploded view showing the magnetization vectors representing unidirectional magnetic orientations in the layers of the magnetic structure antiparallel to one another.
Figure 3B:
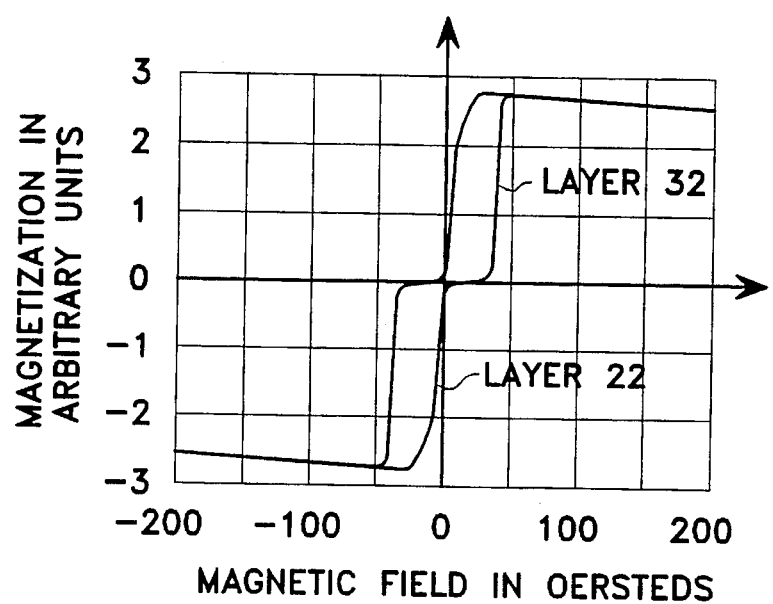
FIG. 3B is a hysteresis curve depicting the magnetic characteristics of the structure illustrated in FIGS. 1A–1D, with applied characterization field 60.

In the preferred method, the thickness of the first and second layers of ferromagnetic material 22 and 32 is each deposited within the range of 100 Å to 200 °. The antiferromagnetic material layer is deposited to a thickness of between 250 Å to 500 Å. The B-H hysteresis loop of the structure shown in FIG. 1D is illustrated in FIG. 3B, where layers 22 and 32 are each exchange coupled in opposite directions. As a result, a split loop is formed. Layers 22 and 32 possess the same exchange strength in magnitude but are shifted to opposite field polarity.

Figure 4A:
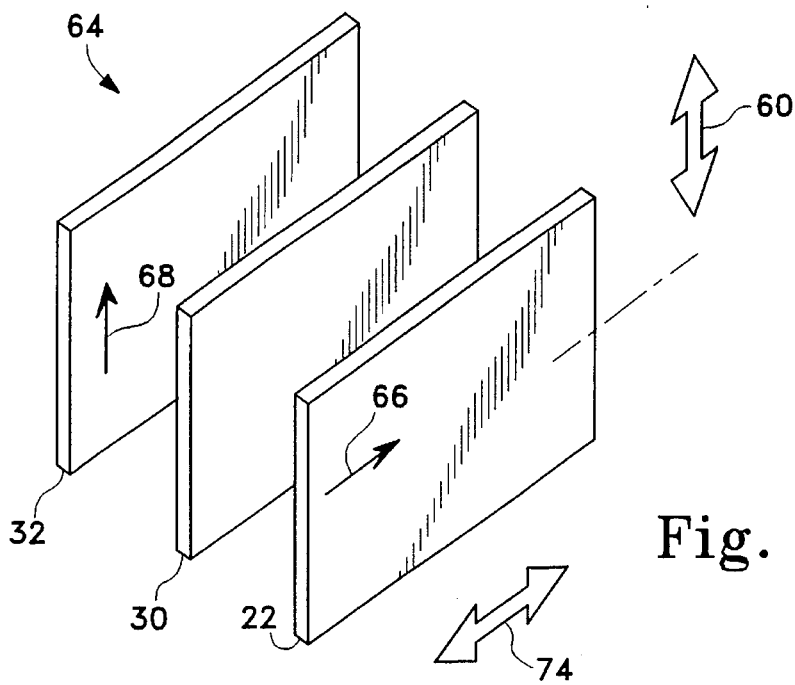
FIG. 4A is an exploded view showing the magnetization vectors representing unidirectional orientations in the layers of the magnetic Structure perpendicular to each other.
Figure 4B:
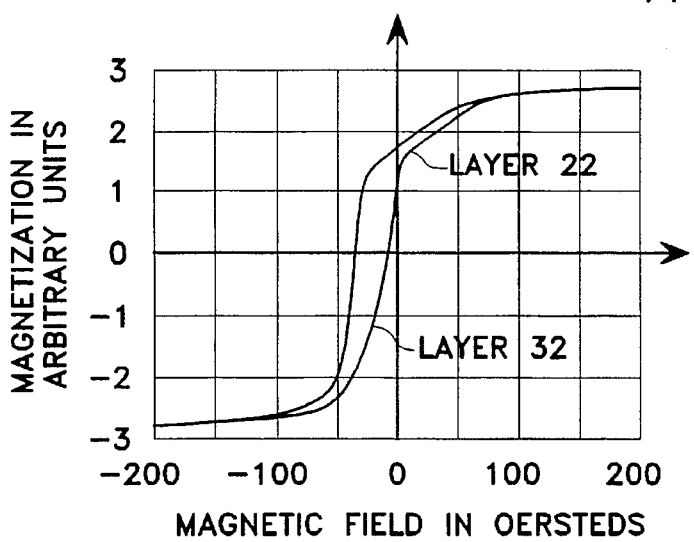
FIGS. 4B and 4C are hysteresis curves depicting the magnetic characteristics of the layers shown in FIG. 4A with FIG. 4B under applied field 60 and FIG. 4C under applied field 74.
Figure 4C:
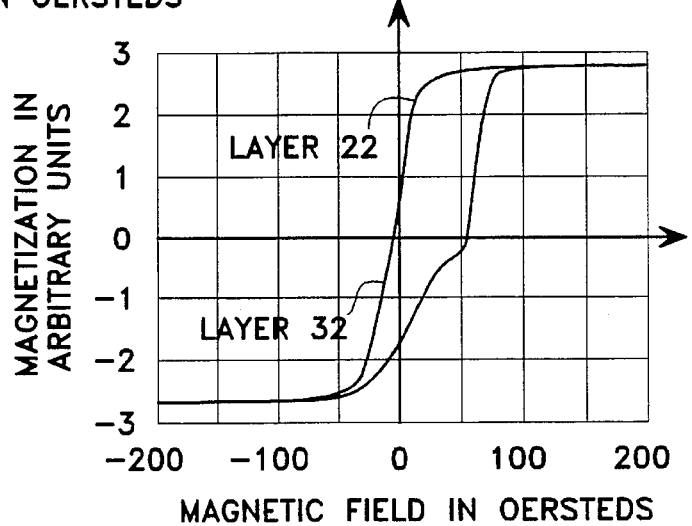
Figure 5A:
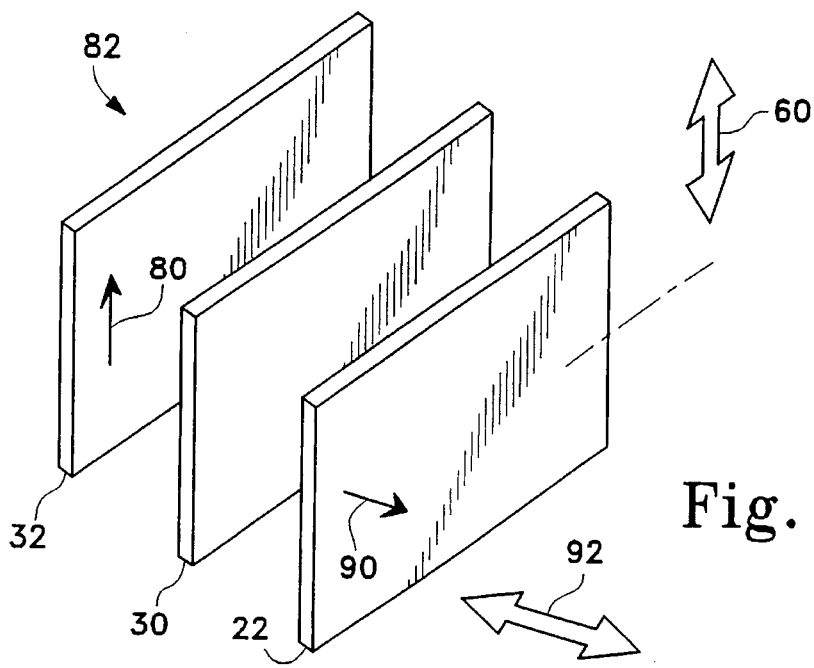
FIG. 5A is an exploded view showing the magnetization vectors representing unidirectional magnetic orientations in the layers of the magnetic structure 45° apart.
Figure 5B:
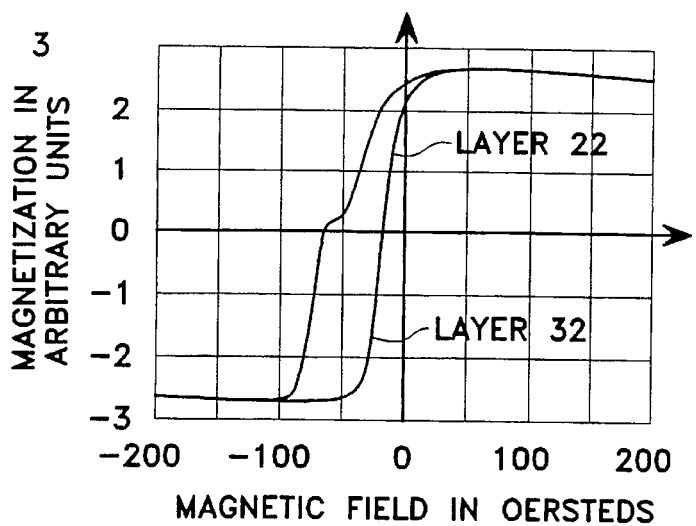
FIGS. 5B and 5C are hysteresis curves depicting the magnetic characteristics of the magnetic structure shown in 5A, with FIG. 5B under applied field 60 and FIG. 5C under applied field 92.
Figure 5C:
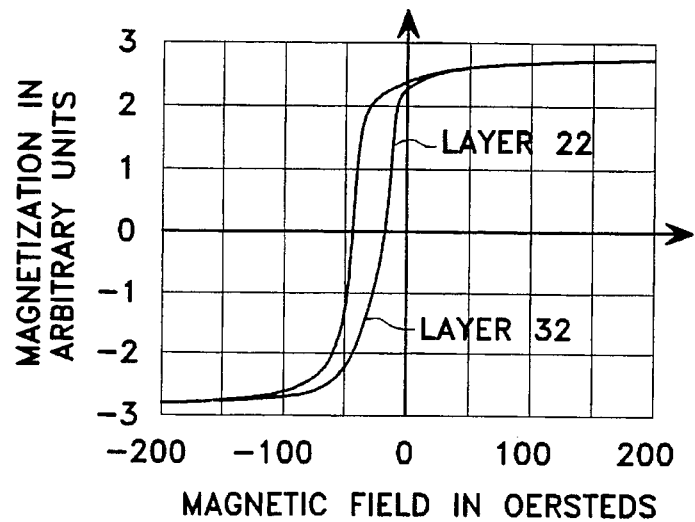

In FIGS. 1A, 1B, 1C and 1D applied field 34 is made opposite to field 26, that is, a 180° difference. The resultant hysteresis loop for the structure shown in FIG. 1D is illustrated in FIG. 3B, with the magnetic field sweeping back and forth along the direction of the bidirectional arrow 60 of FIG. 3A. If the field 34 is applied perpendicular to field 26, that is, a 90° difference, the exchange coupling effect and the applied magnetic field will exchange bias layer 22 along the applied field direction 66 and layer 32 along the direction 68, respectively (shown in FIG. 4A). Local exchange anisotropy will 90° apart in these two ferromagnetic layers. When a hysteresis loop is recorded with the field sweeping along direction 60 as seen in FIG. 4A, layer 22 will be recorded as hard axis characteristics, while layer 32 will appear in an exchange biased state. FIG. 4B reflects this phenomenom. If the field is swept along direction 74 in FIG. 4A, layer 22 will be in an exchange biased state while layer 32 is in its hard axis state. FIG. 4C shows this phenomenon. When the applied field 34 is set to be 45° apart from field 26 during deposition of layer 32, the resultant local exchange anisotropy in layers 22 and 32 will be set at 45° apart. FIGS. 5A–5C demonstrate the schematics and the recorded loops.

Using only one thin antiferromagnetic film or layer 30 and applying an appropriate magnetic field to ferromagnetic films or layers 22 and 32 during deposition, different local exchange anisotropy arrangements can be established, as pairs 46 and 52, 66 and 68 and 90 and 68.

If the method is used to build a transducer, subsequent steps of depositing and patterning can be performed on the resultant structure as shown in FIG. 1D.

While the method of the invention has been described for specific applications, as illustrated herein, various thin film products can be built utilizing the inventive method. Other variations are possible within the scope of the invention. For example, layers 22, 30 and 32 can be deposited by methods such as chemical vapor deposition (CVD) or electroplating. The magnetic fields 28, 34 and 40 can be generated by means other than by electromagnets, for example, permanent magnet, and the change of field orientation canbe achieved by reorienting wafers. In addition, the magnetization vectors in the first and second layers 22 and 32 can be implemented without a simultaneous magnetic field during deposition. Instead, after deposition, the resultant structure can be heated up beyond the blocking temperature and cooled down in a magnetic field, provided that the first and second ferromagnetic layers have different blocking temperatures. Moreover, other materials than those disclosed herein can be used to implement the invention.

What is claimed is:

1. A method of forming a thin film magnetic structure, comprising the steps of:
   providing a substrate;
   depositing a first layer of ferromagnetic material on said substrate in the presence of a magnetic field oriented in a first direction;
   depositing a layer of antiferromagnetic material on said first layer of ferromagnetic material; and
   depositing a second layer of ferromagnetic material on saidlayer of antiferromagnetic material in the presence of a magnetic field oriented in a second direction, said first layer of ferromagnetic material being spaced from said second layer of ferromagnetic material by said antiferromagnetic material.

2. The method of forming a thin film magnetic structure as set forth in claim 1 wherein said layer of antiferromagnetic material is electrically insulating.

3. The method of forming a thin film magnetic structure as set forth in claim 2 wherein said layer of electrically insulating antiferromagnetic material is formed of a material selected from the group of NiC—O, Ni—O and $Fe_2O_3$.

4. The method of forming a thin film magnetic structure as set forth in claim 1 wherein said first and second magnetic field directions are antiparallel to each other.

5. The method of forming a thin film magnetic structure as set forth in claim 1 wherein said first and second magnetic field directions are perpendicular to each other.

6. The method of forming a thin film magnetic structure as set forth in claim 1 wherein said steps of depositing comprise the step of sputtering or the step of ion beam deposition.

7. The method of forming a thin film magnetic structure as set forth in claim 1 wherein said first and second layers of ferromagnetic material are formed of Permalloy, NiFeCo, FeCo or Co.

8. The method of forming a thin film magnetic structure as set forth in claim 1 wherein said layer of antiferromagnetic material is formed of ferrous manganese or nickel manganese.

9. The method of forming a thin film magnetic structure as set forth in claim 1 wherein said steps of depositing said layers are performed below the blocking temperature of said ferromagnetic material.

10. A method of forming a thin film magnetic structure comprising the steps of:
    providing a substrate;
    applying a first magnetic field oriented in a first direction to said structure;
    depositing a first layer of ferromagnetic material on said substrate;
    depositing a layer of antiferromagnetic material on said first layer of ferromagnetic material;
    applying a second magnetic field oriented in a second direction to said structure;
    depositing a second layer of ferromagnetic material on said layer of antiferromagnetic material, such that said first layer of ferromagnetic material is spaced from said second layer of ferromagnetic material by said layer of antiferromagnetic material; and
    terminating said second magnetic field.

11. The method of forming a thin film magnetic structure as set forth in claim 10 wherein said steps of depositing said ferromagnetic layers are performed at temperatures below the blocking temperature of said ferromagnetic material.

12. The method of forming a thin film magnetic structure as set forth in claim 11 wherein said layer of antiferromagnetic material is formed from a material selected from the group comprising NiCo—O, Ni—O, $Fe_2O_3$, FeMn and NiMn.

13. The method of forming a thin film magnetic structure as set forth in claim 10 wherein said first and second directions are antiparallel to each other.

14. The method of forming a thin film magnetic structure as set forth in claim 10 wherein said first and second directions are perpendicular to each other.

15. The method of forming a thin film magnetic structure as set forth in claim 10 wherein said antiferromagnetic material comprises ferrous manganeseor nickel manganese.

16. A method of forming a thin film magnetic structure having different magnetization orientations provided by a common magnetic bias layer, comprising the steps of:
    providing a substrate;
    depositing a first layer of ferromagnetic material on said substrate in the presence of a first magnetic field oriented in a first direction, said first magnetic field inducing a first direction of uniaxial anisotropy in said first layer;
    depositing on said first layer a layer of antiferromagnetic material having first and second major surfaces, said first major surface being in contact with said first layer of ferromagnetic material; and
    depositing on said layer of antiferromagnetic material a second layer of ferromagnetic material in the presence of a second magnetic field oriented in a second direction, said second layer of ferromagnetic material being in contact with said second major surface of said antiferromagnetic layer, said second magnetic field inducing a second direction of uniaxial anisotropy in said second layer, said first and second layers of ferromagnetic material being spaced from each other by said layer of antiferromagnetic material;

wherein said first and second directions of uniaxial anisotropy mutually exchange-couple with said first and second major surfaces of said layer of antiferromagnetic material, such that said layer of antiferromagnetic material constitutes said common magnetic bias layer for providing different magnetization orientations as said first and second directions of uniaxial anisotropy in said first and second layers of ferromagnetic material.

17. The method of forming a thin film magnetic structure as set forth in claim 16 wherein said first and second directions are angularly oriented with respect to each other.

18. The method of forming a thin film magnetic structure as set forth in claim 16 wherein said first and second directions are antiparallel to each other.

19. The method of forming a thin film magnetic structure as set forth in claim 16 wherein said first and second layers comprise Permalloy and said layer of antiferromagnetic material is formed from a material selected from the group comprising NiCo—O, Ni—O, $Fe_2O_3$, FeMn and NiMn.

20. The method of forming a thin film magnetic structure as set forth in claim 19 where said layer of antiferromagnetic material is deposited to a thickness of between 200 to 250 Angstroms, and each of said first and second layers of ferromagnetic material is deposited to a thickness of between 100 to 200 Angstroms.

21. The method of forming a thin film magnetic structure as set forth in claim 16 wherein said steps of depositing comprise the step of sputtering or the ion beam deposition.

22. The method of forming a thin film magnetic structure as set forth in claim 16 wherein said steps of depositing said layers are performed below the blocking temperature of said ferromagnetic material.

23. The method of forming a thin film magnetic structure as set forth in claim 16, including the step of patterning electrical lead layers in contact with said first and second layers of ferromagnetic material.

* * * * *